US009991184B2

(12) United States Patent
Ikeda

(10) Patent No.: US 9,991,184 B2
(45) Date of Patent: Jun. 5, 2018

(54) ELECTRONIC MODULE AND METHOD OF MANUFACTURING THE SAME

(71) Applicant: SHINDENGEN ELECTRIC MANUFACTURING CO., LTD., Tokyo (JP)

(72) Inventor: Kosuke Ikeda, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days. days.

(21) Appl. No.: 14/648,636

(22) PCT Filed: May 28, 2013

(86) PCT No.: PCT/JP2013/063299
§ 371 (c)(1),
(2) Date: May 29, 2015

(87) PCT Pub. No.: WO2014/184846
PCT Pub. Date: Nov. 20, 2014

(65) Prior Publication Data
US 2016/0181175 A1    Jun. 23, 2016

(51) Int. Cl.
*H01L 23/367* (2006.01)
*H01L 23/498* (2006.01)
(Continued)

(52) U.S. Cl.
CPC ...... *H01L 23/3672* (2013.01); *H01L 21/4817* (2013.01); *H01L 21/565* (2013.01);
(Continued)

(58) Field of Classification Search
None
See application file for complete search history.

(56) References Cited

U.S. PATENT DOCUMENTS 6,285,079 B1 * 9/2001 Kunikiyo ............ H01L 23/3114
257/737
2006/0056213 A1 * 3/2006 Lee ..................... H01L 23/4334
363/144
(Continued)

FOREIGN PATENT DOCUMENTS

CN  1507767  6/2004
CN  1976573  6/2007
(Continued)

OTHER PUBLICATIONS

International Preliminary Report on Patentability (Chapter I) for PCT/JP2013/063299 dated Nov. 17, 2015.
(Continued)

*Primary Examiner* — Kimberly Rizkallah
*Assistant Examiner* — Bo Bin Jang
(74) *Attorney, Agent, or Firm* — Ladas & Parry, LLP

(57) ABSTRACT

An electronic module 1 includes an electronic module 10 that includes a substrate 11 and an electronic element 12, an electronic module 20 that includes a substrate 21 arranged such that the principal surface 21a faces the principal surface 11a, an electronic element 22 electrically connected to the electronic element 12 with a connecting member 18 therebetween, and an electronic element 23 electrically connected to the electronic element 12 with a connecting member 19 therebetween passing through the substrate 21 in a thickness direction, the electronic module 20 thermally connected to the electronic module 10 by the connecting members 18 and 19, and a heat sink 30 that includes a housing part 31a therein and houses the electronic modules 10 and 20 in the housing part 31a such that the principal surface 11b is in contact with an inner wall surface of the housing part 31a.

10 Claims, 6 Drawing Sheets

(51) Int. Cl.
    *H01L 23/538*      (2006.01)
    *H01L 23/42*      (2006.01)
    *H01L 23/051*      (2006.01)
    *H01L 23/00*      (2006.01)
    *H01L 25/07*      (2006.01)
    *H01L 25/16*      (2006.01)
    *H01L 21/48*      (2006.01)
    *H01L 21/56*      (2006.01)
    *H01L 23/055*      (2006.01)
    *H01L 23/16*      (2006.01)
    *H01L 25/065*      (2006.01)
    *H01L 25/00*      (2006.01)
    *H01L 23/48*      (2006.01)
    *H01L 23/373*      (2006.01)
    *H01L 21/50*      (2006.01)

(52) U.S. Cl.
CPC .......... *H01L 23/051* (2013.01); *H01L 23/055* (2013.01); *H01L 23/16* (2013.01); *H01L 23/3675* (2013.01); *H01L 23/42* (2013.01); *H01L 23/48* (2013.01); *H01L 23/49827* (2013.01); *H01L 23/49838* (2013.01); *H01L 23/49844* (2013.01); *H01L 23/49866* (2013.01); *H01L 23/5385* (2013.01); *H01L 24/13* (2013.01); *H01L 24/33* (2013.01); *H01L 24/73* (2013.01); *H01L 24/83* (2013.01); *H01L 24/92* (2013.01); *H01L 25/0657* (2013.01); *H01L 25/071* (2013.01); *H01L 25/165* (2013.01); *H01L 25/50* (2013.01); *H01L 21/50* (2013.01); *H01L 23/3735* (2013.01); *H01L 23/3737* (2013.01); *H01L 24/16* (2013.01); *H01L 24/29* (2013.01); *H01L 24/32* (2013.01); *H01L 24/81* (2013.01); *H01L 2224/133* (2013.01); *H01L 2224/13016* (2013.01); *H01L 2224/1318* (2013.01); *H01L 2224/13082* (2013.01); *H01L 2224/13147* (2013.01); *H01L 2224/13294* (2013.01); *H01L 2224/16237* (2013.01); *H01L 2224/293* (2013.01); *H01L 2224/29294* (2013.01); *H01L 2224/32013* (2013.01); *H01L 2224/32014* (2013.01); *H01L 2224/32225* (2013.01); *H01L 2224/32227* (2013.01); *H01L 2224/32245* (2013.01); *H01L 2224/3303* (2013.01); *H01L 2224/33181* (2013.01); *H01L 2224/73203* (2013.01); *H01L 2224/73253* (2013.01); *H01L 2224/73265* (2013.01); *H01L 2224/81447* (2013.01); *H01L 2224/81815* (2013.01); *H01L 2224/8348* (2013.01); *H01L 2224/83447* (2013.01); *H01L 2224/83815* (2013.01); *H01L 2224/9211* (2013.01); *H01L 2224/9221* (2013.01); *H01L 2224/92247* (2013.01); *H01L 2225/06548* (2013.01); *H01L 2225/06555* (2013.01); *H01L 2225/06572* (2013.01); *H01L 2225/06582* (2013.01); *H01L 2225/06589* (2013.01); *H01L 2924/13055* (2013.01); *H01L 2924/13091* (2013.01); *H01L 2924/1611* (2013.01); *H01L 2924/1679* (2013.01); *H01L 2924/16152* (2013.01); *H01L 2924/16724* (2013.01)

(56) References Cited

U.S. PATENT DOCUMENTS

2012/0119346 A1* 5/2012 Im .................. H01L 21/563
                                                                           257/690
2012/0139097 A1* 6/2012 Jin .................. H01L 21/561
                                                                           257/712

FOREIGN PATENT DOCUMENTS

| JP | 2001-156225 | 6/2001 |
|----|-------------|--------|
| JP | 2003-273319 | 9/2003 |
| JP | 2004-88022 | 3/2004 |
| JP | 2005-150419 | 6/2005 |
| JP | 2008-141058 | 6/2008 |
| JP | 2010-278113 | 12/2010 |
| JP | 2011-129797 | 6/2011 |
| JP | 2012-109572 | 6/2012 |
| JP | 2012-191012 | 10/2012 |
| JP | 2012-204632 | 10/2012 |
| JP | 2012-227399 | 11/2012 |
| JP | 2012-227532 | 11/2012 |

OTHER PUBLICATIONS

Written Opinion of the International Searching Authority for PCT/JP2013/063299 dated Jul. 30, 2013 and its English translation from WIPO.

Office Action dated Nov. 18, 2014 for Japanese Patent Application No. 2014-502287 and its English summary provided by Applicant's foreign counsel.

International Search Report for PCT/JP2013/063299 dated Jul. 30, 2013.

Office Action and Search report dated Aug. 31, 2016 for Chinese patent application No. 201380002160.3 with English translation provided by the Applicant's foreign counsel.

* cited by examiner

ELECTRONIC MODULE AND METHOD OF MANUFACTURING THE SAME

CROSS-REFERENCE TO RELATED APPLICATION(S)

This application is the U.S. National Stage of International Patent Application No. PCT/JP2013/063299, filed on May 13, 2013 the disclosure of which is hereby incorporated in its entirety by reference.

TECHNICAL FIELD

The present invention relates to an electronic module and a method of manufacturing the same, and more specifically, an electronic module including a heat sink and a method of manufacturing the same.

BACKGROUND ART

As one type of electronic module, regulators are known to obtain a desired output power from an input power. As shown in FIG. 6, a conventional regulator 100 includes a power part 110, a controlling part 120, and a heat sink 130. The power part 110 converts power with an electronic element 112 such as a semiconductor switching element mounted on a substrate 111. The controlling part 120 controls the power part 110 with an electronic element 122 such as a controlling element mounted on a substrate 121. The power part 110 and the controlling part 120 are electrically connected to each other by a connecting terminal 113. The heat sink 130 includes a base plate 131 and a plurality of fins 132 erected on a bottom surface of the base plate 131. In addition, the regulator 100 is connected to an external device through an external connecting terminal 123.

In the conventional regulator 100, as shown in FIG. 6, both of the power part 110 and the controlling part 120 are provided upon the base plate 131 of the heat sink 130.

Note that, in Patent Literature 1, as one type of electronic module, there is described a semiconductor device including cooling members provided on both surfaces of a semiconductor chip and each having fins to improve a thermal radiation property. Since the cooling members are provided on both surfaces of the semiconductor chip, the size of the electronic module becomes large.

CITATION LIST

Patent Literature

Patent Literature 1: Japanese Patent Laid-Open No. 2001-156225

SUMMARY OF INVENTION

Technical Problem

As described above, in electronic modules such as the conventional regulator, since the power part 110 and the controlling part 120 are provided and arranged upon a single plane, the size thereof as a whole becomes large. That is, there is a problem of difficulty in downsizing an electronic module that includes a heat sink such as a regulator.

Thus, the present invention has an object to provide an electronic module that can be downsized, and a method of manufacturing the same.

Solution to Problem

An electronic module according to one aspect of the present invention includes:

a first electronic module including a first substrate that has a first principal surface and a second principal surface on a side opposite to the first principal surface, and a first electronic element that is mounted on the first principal surface;

a second electronic module including a second substrate that has a third principal surface and a fourth principal surface on a side opposite to the third principal surface and that is arranged such that the third principal surface faces the first principal surface, a second electronic element that is mounted on the third principal surface and is electrically connected to the first electronic element with a first connecting member therebetween, and a third electronic element that is mounted on the fourth principal surface and is electrically connected to the first electronic element with a second connecting member therebetween passing through the second substrate in a thickness direction, the second electronic module being thermally connected to the first electronic module by the first and second connecting members; and a heat sink including a base plate that has a housing part therein, and housing the first and second electronic modules in the housing part such that the second principal surface of the first substrate is in contact with an inner wall surface of the housing part.

The electronic module may further include
a cap part that houses the second substrate and covers the first principal surface of the first substrate, an outer surface of the cap part being in contact with an inner wall surface of the housing part of the heat sink, wherein a side surface of the second substrate is in contact with an inner surface of the cap part.

Further, in the electronic module,
the cap part may be made of a metal having a surface subjected to insulating treatment.

The electronic module may further include
a sealing resin that fills an inside of the cap part so as to embed the first electronic element, the second electronic element, and the third electronic element.

The electronic module may further include
a cap part that covers the fourth principal surface of the second substrate, an outer surface of the cap part being in contact with an inner wall surface of the housing part of the heat sink.

The electronic module may further include
a sealing resin that fills an inside of the cap part so as to embed the third electronic element.

The electronic module may further include
a sealing resin that fills between the first electronic module and the second electronic module so as to embed the first electronic element and the second electronic element.

Further, in the electronic module,
the first substrate may include:
a first insulating substrate;
a conductive pattern that is provided on a principal surface on a first principal surface side of the first insulating substrate and is electrically connected to the first electronic element with a conductive binder therebetween; and
a conductive layer that is provided on a principal surface on a second principal surface side of the first insulating substrate and is in contact with the inner wall surface of the housing part of the heat sink.

Further, in the electronic module, a depressed portion is provided on the conductive layer, and a heat conductive member is arranged in the depressed portion so as to be in contact with the inner wall surface of the housing part.

A method of manufacturing an electronic module according to one aspect of the present invention includes:

mounting a first electronic element on one principal surface of a first substrate with a conductive binder therebetween;

mounting a second electronic element on one principal surface of a second substrate with a conductive binder therebetween, and mounting a third electronic element on another principal surface of the second substrate with a conductive binder therebetween;

assembling in which the second substrate is arranged facing the first substrate such that a first connecting member made of a conductive material is sandwiched between the first electronic element and the second electronic element and such that a second connecting member made of a conductive material is inserted into a through hole passing through the second substrate in a thickness direction and is connected to the first electronic element with a conductive binder therebetween, and thereafter, heat treatment is performed to fix the first to third electronic elements and the first and second connecting members, whereby a stack module is produced; and housing in which the stack module is housed in a housing part provided inside a base plate of a heat sink such that the other principal surface of the first substrate is in contact with an inner wall surface of the housing part.

The method of manufacturing an electronic module may further include after the assembling and before the housing, putting a cap part having an outside shape fitting the housing part on the stack module so as to house the second substrate and cover the first principal surface of the first substrate, wherein in the housing, the stack module covered with the cap part is housed in the heat sink such that an outer surface of the cap part is in contact with an inner wall surface of the housing part.

Further, in the method of manufacturing an electronic module, a resin injection hole passing through the cap part in a thickness direction is provided in the cap part, a through hole passing through the second substrate in a thickness direction is provided in the second substrate, and after the cap part is put on the stack module, a resin is injected through the resin injection hole of the cap part, thereby filling the inside of the cap part so as to embed the first electronic element, the second electronic element, and the third electronic element.

The method of manufacturing an electronic module may further include after the assembling and before the housing, putting a cap part having an outside shape fitting the housing part on the stack module so as to cover the fourth principal surface of the second substrate, wherein in the housing, the stack module covered with the cap part is housed in the heat sink such that an outer surface of the cap part is in contact with the inner wall surface of the housing part.

Further, in the method of manufacturing an electronic module, a resin injection hole passing through the cap part in a thickness direction is provided in the cap part, and the method further includes:

after the cap part is put on the stack module, filling the inside of the cap part with a resin so as to embed the third electronic element by injecting the resin through the resin injection hole of the cap part; and after the housing, filling the inside of the housing part with a resin so as to embed the first electronic element and the second electronic element.

Advantageous Effects of Invention

In the electronic module according to the present invention, the first electronic module and the second electronic module that is thermally connected to the first electronic module by the first and second connecting members are housed in the housing part provided in the base plate of the heat sink, such that the second principal surface of the first substrate is in contact with the inner wall surface of the housing part. As a result, the first and second electronic modules are not provided upon the base plate, and the horizontal size of the base plate can be reduced to about the same size as a larger size between the horizontal sizes of the first and second electronic modules. Therefore, according to the present invention, the electronic module can be considerably downsized.

DESCRIPTION OF EMBODIMENTS

Figure 1:
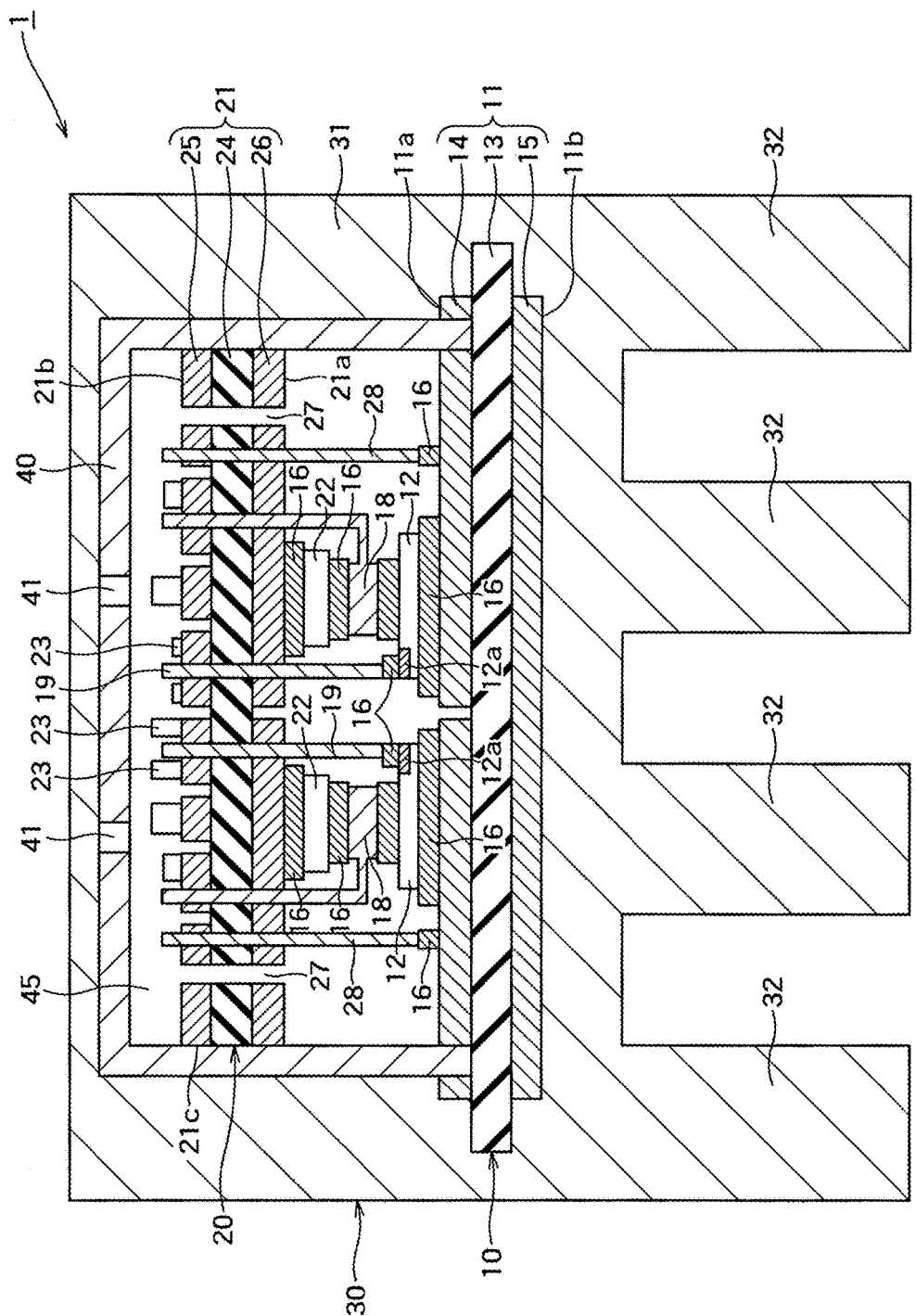
FIG. 1 is a cross sectional view of an electronic module according to a first embodiment of the present invention.

Electronic modules according to embodiments of the present invention will be described below with reference to the drawings. Note that, in the drawings, the same numerical references are used for components each having an equivalent function, and descriptions of the components of the same numerical references will not be repeated. In addition, the drawings are schematic views, and a relation between thicknesses of respective components and plane dimensions, ratios among the thicknesses of the respective components, and the like differ from those of an actual electronic module.

First Embodiment

Figure 2:
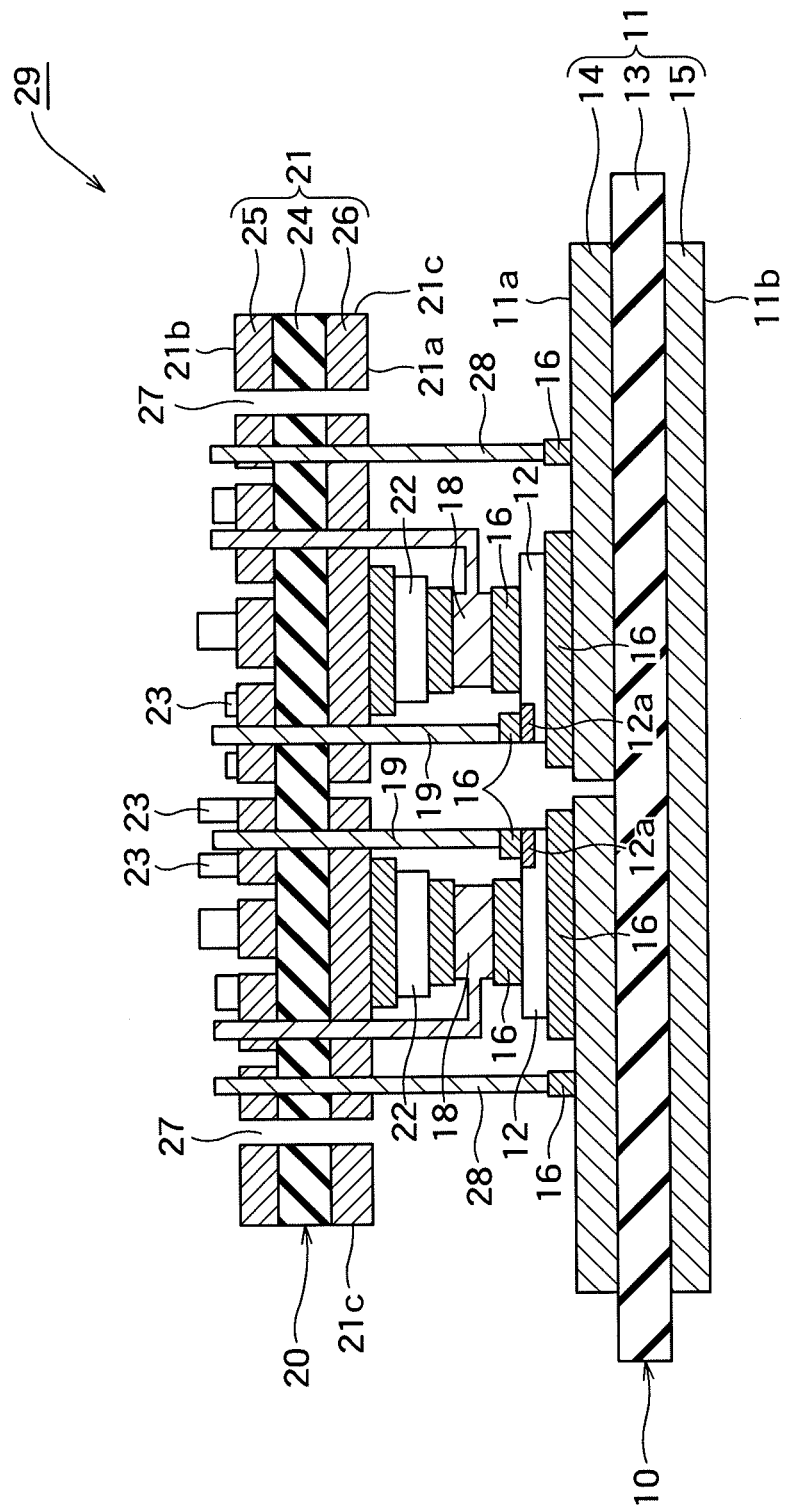
FIG. 2 is a cross sectional view of a stack module according to the first embodiment in which two electronic modules are stacked.
Figure 3:
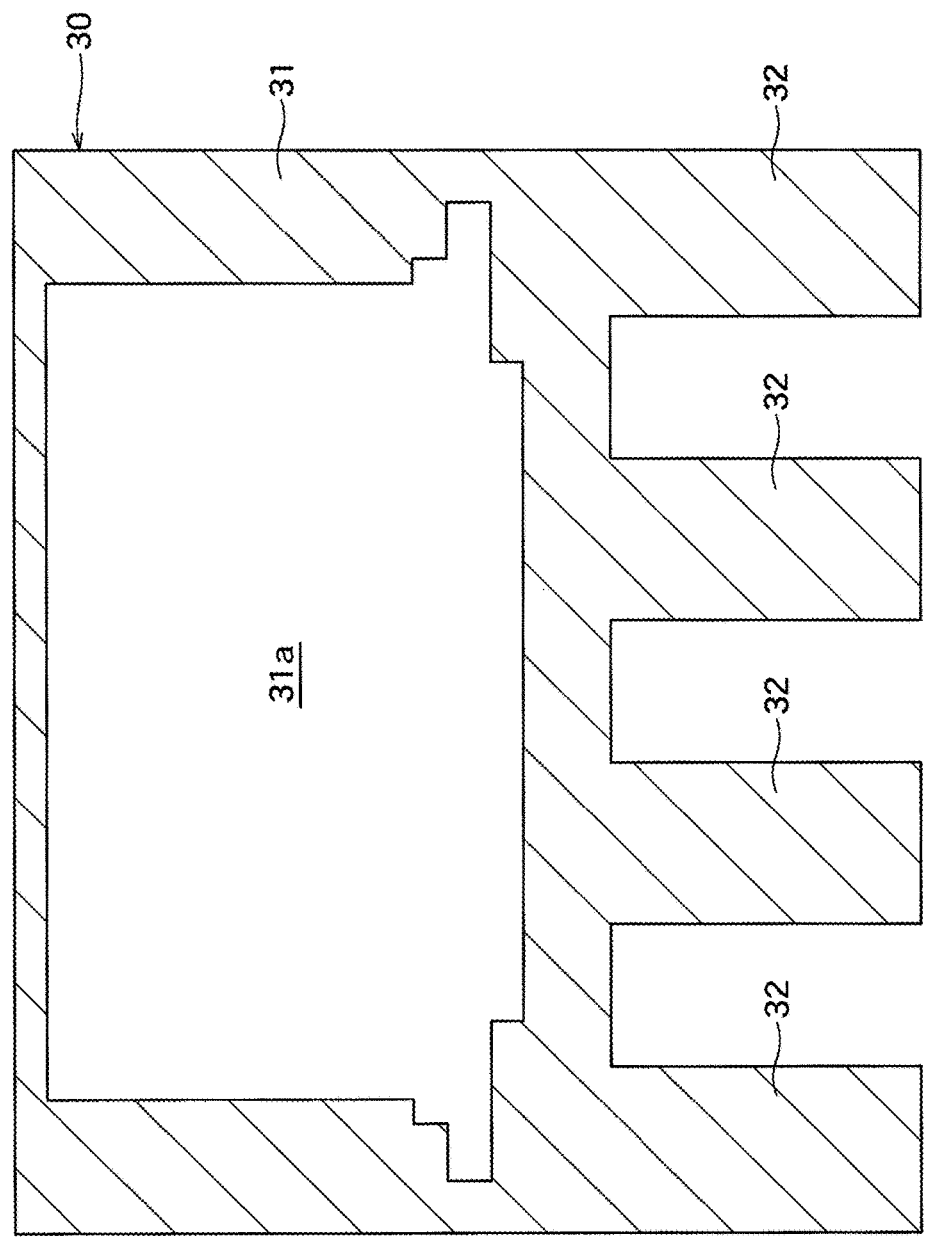
FIG. 3 is a cross sectional view of a heat sink according to the first embodiment, which includes a housing part.

A first embodiment of the present invention will be described with reference to FIGS. 1 to 3. FIG. 1 is a cross sectional view of an electronic module 1 according to the first embodiment. FIG. 2 is a cross sectional view of a stack module 29 in which two electronic modules 10 and 20 are stacked. FIG. 3 is a cross sectional view of a heat sink 30 according to the first embodiment which includes a housing part 31a.

The electronic module 1 according to the first embodiment includes the electronic module 10, the electronic module 20 stacked on the electronic module 10, and the heat sink 30 housing therein the electronic module 10 and the electronic module 20.

As shown in FIG. 2, the electronic module 10 and the electronic module 20 are stacked to form the stack module 29. The horizontal size of a substrate 21 is smaller than the horizontal size of the substrate 11. In addition, the electronic module 20 is stacked on the electronic module 10 such that the substrate 21 is included in the substrate 11 when the stack module 29 is viewed in a thickness direction.

The electronic module 20 is electrically and thermally connected to the electronic module 10 by connecting members 18, 19, and 28 each made of a conductive material. The connecting members 18, 19, and 28 are provided, as shown in FIG. 2, so as to each pass through the substrate 21 in a thickness direction.

The connecting member 18 electrically connects an electronic element 12 and an electronic element 22. The connecting member 19 electrically connects the electronic element 12 and an electronic element 23. The connecting member 28 electrically connects a conductive pattern 14 and conductive patterns 25 and 26.

From a viewpoint of noise reduction, the connecting members 18, 19, and 28 are preferably provided so as to connect the respective electronic elements taking the shortest routes. For example, the connecting members 18, 19, and 28 are each formed by a plate-like or columnar straight member.

Note that the connecting members 18, 19, and 28 are each made of, for example, a copper (Cu), a molybdenum (Mo), an alloy of copper and molybdenum (Cu—Mo), or an alloy of copper and tungsten (Cu—W).

Each component will be described below in detail.

The electronic module 10 includes the substrate 11 having a principal surface 11a and a principal surface 11b on the side opposite to the principal surface 11a, and the electronic element 12 mounted on the principal surface 11a.

As shown in FIG. 2, the substrate 11 includes an insulating substrate 13 made of an insulating material such as a ceramic, a conductive pattern 14 formed by performing pattern processing to a conductive layer (such as a copper foil) made of a conductor, and a conductive layer 15 made of a conductor such as a copper. The conductive pattern 14 is provided on the principal surface of the insulating substrate 13 on the principal surface 11a side of the substrate 11, that is, provided on the upper surface of the insulating substrate 13, in FIG. 2. The conductive layer 15 is provided on the principal surface of the insulating substrate 13 on the principal surface 11b side of the substrate 11, that is, provided on the lower surface of the insulating substrate 13, in FIG. 2. The conductive pattern 14 is electrically connected to the electronic element 12 with a conductive binder 16 such as a solder therebetween.

In addition, as seen in FIG. 1, the conductive layer 15 of the substrate 11 is in contact with an inner wall surface of the housing part 31a of the heat sink 30.

The electronic element 12 is, for example, an element that generates more heat than the electronic elements 22 and 23 of the electronic module 20. More particularly, the electronic element 12 is a switching element such as a power MOSFET and an Insulated Gate Bipolar Transistor (IGBT). A controlling terminal 12a of the electronic element 12 is a controlling terminal to control the electronic element 12 as the switching element in a conduction state or in a cut-off state. The electronic element 12 as the switching element controls current flowing in a vertical direction, in FIG. 2.

The electronic module 20 includes, as shown in FIG. 2, the substrate 21, the electronic element 22 mounted on one surface of the substrate 21, and the electronic element 23 mounted on another surface of the substrate 21.

As shown in FIG. 2, the substrate 21 includes a principal surface 21a, and a principal surface 21b on the side opposed to the principal surface 21a, and is arranged such that the principal surface 21a faces the principal surface 11a of the substrate 11.

The substrate 21 includes an insulating substrate 24 made of an insulating material such as a ceramic, and the conductive patterns 25 and 26 formed by performing pattern processing to a conductive layer (such as a copper foil) provided on the insulating substrate 24. The conductive pattern 25 is provided on the principal surface of the insulating substrate 24 on the principal surface 21b side of the substrate 21, that is, provided on the upper surface of the insulating substrate 24, in FIG. 2. The conductive pattern 26 is provided on the principal surface of the insulating substrate 24 on the principal surface 21a side of the substrate 21, that is, provided on the lower surface of the insulating substrate 24, in FIG. 2.

In addition, as shown in FIG. 2, the substrate 21 includes a through hole 27 passing through the substrate 21 in a thickness direction.

The electronic element 22 is, as shown in FIG. 2, mounted on the principal surface 21a of the substrate 21, and is electrically connected to the electronic element 12 with the connecting member 18 therebetween. More specifically, the electronic element 22 is electrically connected to the conductive pattern 26 with the conductive binder 16 therebetween as well as electrically connected to the electronic element 12 with the connecting member 18 therebetween. The electronic element 22 is, for example, a rectifying element connected in parallel to the electronic element 12 as the switching element.

The electronic element 23 is mounted on the principal surface 21b of the substrate 21, and is electrically connected to the electronic element 12 (controlling terminal 12a) with the connecting member 19 therebetween. The electronic element 23 is electrically connected to the conductive pattern 25 with a conductive binder (not shown) therebetween. The electronic element 23 is, for example, an active element (controlling chip) to control the electronic element 12. The principal surface 21b of the substrate 21 also includes passive elements mounted thereon such as a resistor, a capacitor, and a coil.

The heat sink 30 is for cooling the electronic module 10 and the electronic module 20, and as shown in FIG. 3, includes the base plate 31 having the housing part 31a therein, and a plurality of fins 32 erected on the base plate 31.

The housing part 31a is provided as, for example, a through hole that passes from one side surface of the base plate 31 to a side surface on the opposite side thereof. Alternatively, the housing part 31a may be formed by depressed portion formed on the one side surface or the upper surface of the base plate 31.

As shown in FIG. 1, the heat sink 30 houses the electronic module 10 and the electronic module 20 in the housing part 31a such that the principal surface 11b of the substrate 11 is in contact with the inner wall surface of the housing part 31a.

As described above, in the electronic module 1 of the present embodiment, the electronic module 10 and the electronic module 20 are stacked to form the stack module 29. In the stack module 29, the electronic module 10 and the electronic module 20 are thermally connected to each other by the connecting members 18, 19, and 28. Then, the stack module 29 is housed in the heat sink 30 such that the substrate 11 is in contact with the inner wall surface of the housing part 31a.

As a result, the electronic modules 10 and 20 are not provided upon the base plate 31, and the horizontal size of the base plate 31 can be reduced to about the same size as a larger size between the horizontal sizes of the electronic modules 10 and 20. Therefore, according to the present embodiment, the electronic module 1 can be considerably downsized.

In addition, since heat emitted from the electronic elements 12, 22, and 23 mounted on the electronic modules 10 and 20 is transmitted to the heat sink 30 through the substrate 11 of the electronic module 10, a thermal radiation property can be ensured.

Furthermore, by stacking the electronic module 10 and the electronic module 20 and connecting the electronic elements with the connecting members 18, 19, and 28, the interconnection distances between these two electronic modules can be shortened, which can reduce interconnection resistances and parasitic inductances. Therefore, according to the present embodiment, the electronic module 1 can be made to emit less noise.

The electronic module 1 according to the present embodiment has, as shown in FIG. 1, an outside shape fitting the housing part 31a, and includes a cap part 40 that is put on the stack module 29. The cap part 40 houses the substrate 21 and covers the principal surface 11a of the substrate 11 and the outer surface thereof is in contact with the inner wall surface of the housing part 31a. Then, a side surface 21c of the substrate 21 is in contact with the inner surface of the cap part 40. Note that it is possible to provide the cap part 40 without making the base plate 31 larger, by increasing the volume of the housing part 31a to some extent. Therefore, even the provision of the cap part 40 does not increase the size of the electronic module 1.

The cap part 40 is preferably made of a metal having a surface subjected to insulating treatment (for example, an aluminum subjected to alumite treatment), but may be made of an insulator such as a resin. In addition, the cap part 40 includes, as shown in FIG. 1, a resin injection hole 41 passing through the cap part 40 in the thickness direction. The resin injection hole 41 is provided on, for example, the upper surface (the surface facing the substrate 21) of the cap part 40.

By providing the cap part 40, heat from the electronic module 10 and the electronic module 20 can be transmitted to the heat sink 30 from not only the substrate 11 but also the cap part 40. For example, if the electronic element 12 is a switching element that emits a large amount of heat, the heat emitted from the electronic element 12 is radiated through the substrate 11 while being radiated through the connecting members 18 and 19, the electronic module 10, and the cap part 40. Therefore, according to the present embodiment, a thermal radiation property can be enhanced.

As described above, since the electronic module 1 can radiate heat also through the cap part 40, a thermal resistance between the stack module 29 and the heat sink 30 is reduced, which can enhance the thermal radiation property. Therefore, according to the present embodiment, both downsizing electronic module and enhancing the thermal radiation property can be achieved.

Furthermore, in the electronic module 1 including the cap part 40, the electronic module 10 and the electronic module 20 are housed in the heat sink 30 in a sealed state. This can reduce electromagnetic waves emitted to the outside accompanying the operation of the electronic module 1, and can reduce the influence of electromagnetic waves from the outside on the operation of the electronic module.

Note that, as shown in FIG. 1, the electronic module 1 may further include a sealing resin 45 filling the inside of the cap part 40. The sealing resin 45 fills the inside of the cap part 40 so as to embed the electronic element 12, the electronic element 22, and the electronic element 23. This can enhance resistances to exterior environment conditions such as vibration, temperature, and humidity.

In addition, the sealing resin 45 may be made of a resin containing a filler made of a material that has a high thermal conductivity thereby enhancing a heat conductive property. This can further enhance the thermal radiation property of the electronic module 1.

Figure 4:
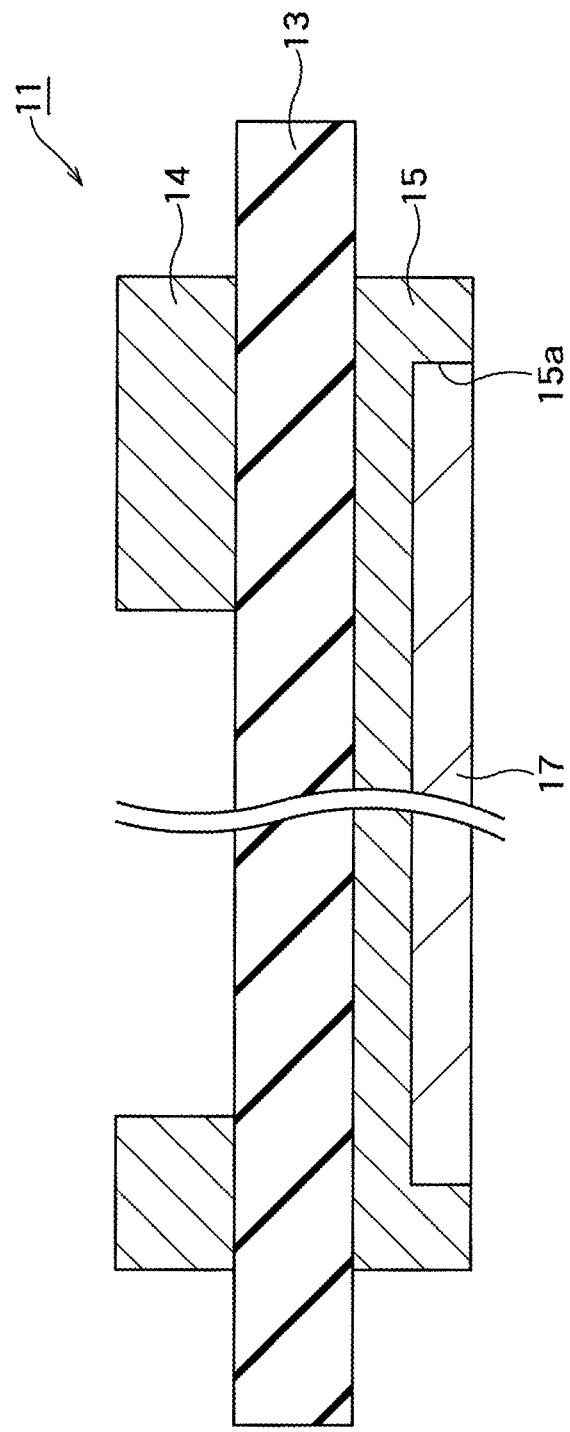
FIG. 4 is a cross sectional view of a substrate according to the first embodiment which includes a heat conductive member arranged in a depressed portion of a conductive layer.

Furthermore, as shown in FIG. 4, a heat conductive member 17 such as a thermal sheet and a thermal grease may be arranged in the substrate 11. In particular, a depressed portion 15a may be provided on the conductive layer 15, and a heat conductive member 17 may be arranged in the depressed portion 15a so as to be in contact with the inner wall surface of the housing part 31a. The distance between the insulating substrate 13 and the heat sink 30 is thereby shortened by the depth of the depressed portion 15a, as compared with the case where the heat conductive member is arranged between the substrate 11 that does not include the depressed portion 15a, and the inner wall surface of the housing part 31a. As a result, the thermal radiation property of the electronic module 1 can be further enhanced.

Next, a method of manufacturing the electronic module 1 according to the first embodiment will be described.

First, the electronic element 12 is mounted on the principal surface 11a of the substrate 11 with the conductive binder 16 therebetween. More specifically, the conductive binder 16 such as a solder paste is printed and formed at a predetermined position on the principal surface 11a of the substrate 11, and thereafter, an electronic element 12 is mounted on the conductive binder 16 by a mounter. Similarly, the electronic element 22 is mounted on the principal surface 21a of the substrate 21 with the conductive binder 16 therebetween, and the electronic element 23 is mounted on the principal surface 21b of the substrate 21 with the conductive binder 16 therebetween.

Next, as shown in FIG. 2, the substrate 21 on which the electronic elements 22 and 23 are mounted is arranged facing the substrate 11 on which the electronic element 12 is mounted. Here, the connecting member 18 is sandwiched between the electronic element 12 and the electronic element 22, and the connecting member 19 is inserted into the through hole of the substrate 21 to be connected to the electronic element 12 with the conductive binder 16 therebetween. Thereafter, heat treatment (reflow) is performed to fix the electronic elements 12, 22, and 23, and the connecting members 18 and 19. The stack module 29 is thereby produced (assembling step). In such a manner, the stack module 29 can be produced in a single reflow process (collective reflow), which can reduce the number of manufacturing steps and a manufacturing time. Note that, after the reflow process, the electronic elements mounted on the substrate 21 may be electrically connected with a metal wire, as necessary.

Next, the cap part 40 is put on the stack module 29 so as to house the substrate 21 and cover the principal surface 11a of the substrate 11. In other words, the cap part 40 is put on the stack module 29 such that the opening edge of the cap part 40 abuts on the principal surface 11a of the substrate 11. Note that, as shown in FIG. 1, in the state where the cap part 40 is put on the stack module 29, the side surface 21c of the substrate 21 is in contact with the inner surface of the cap part 40. In addition, the cap part 40 is fixed to the substrate 11 with an adhesive (such as a silicon adhesive).

Next, a resin is injected through the resin injection hole 41 of the cap part 40, thereby filling the inside of the cap part 40 so as to embed the electronic element 12, the electronic element 22, and the electronic element 23 (resin filling step). More specifically, the resin injected to the resin injection hole 41 passes through the through hole 27 and fills a space (upper space) defined by the cap part 40 and the substrate 21, as well as fills a space (lower space) defined by the cap part 40, the substrate 11, and the substrate 21. Thereafter, in the end, the resin fills the upper space and the lower space to embed the electronic element 12, the electronic element 22, and the electronic element 23. In such a manner, by providing the through hole 27 in the substrate 21, the resin filling step does not need to be divided for the upper space and the lower space, which brings efficiency to the resin filling step.

Next, the produced stack module 29 is housed in the housing part 31a that is provided inside the base plate 31 of the heat sink 30 such that the principal surface 11b of the substrate 11 is in contact with the inner wall surface of the housing part 31a (housing step). In this step, the stack module 29 covered with the cap part 40 is housed in the heat sink 30 such that the outer surface of the cap part 40 is in contact with the inner wall surface of the housing part 31a.

Through the above steps, the electronic module 1 (FIG. 1) of which both of the downsizing and the thermal radiation property are achieved can be manufactured.

Second Embodiment

Figure 5:
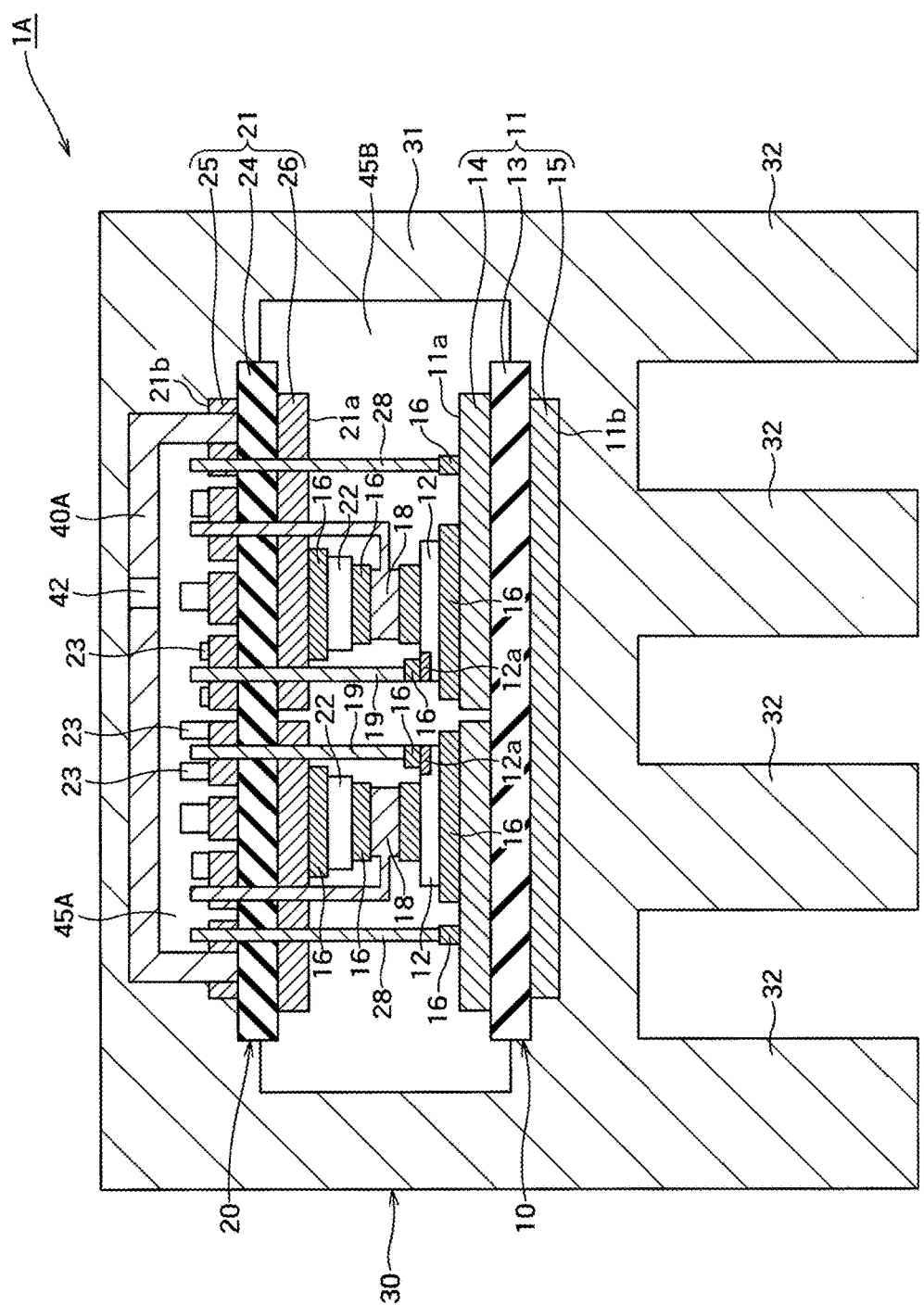
FIG. 5 is a cross sectional view of an electronic module according to a second embodiment of the present invention.
Figure 6:
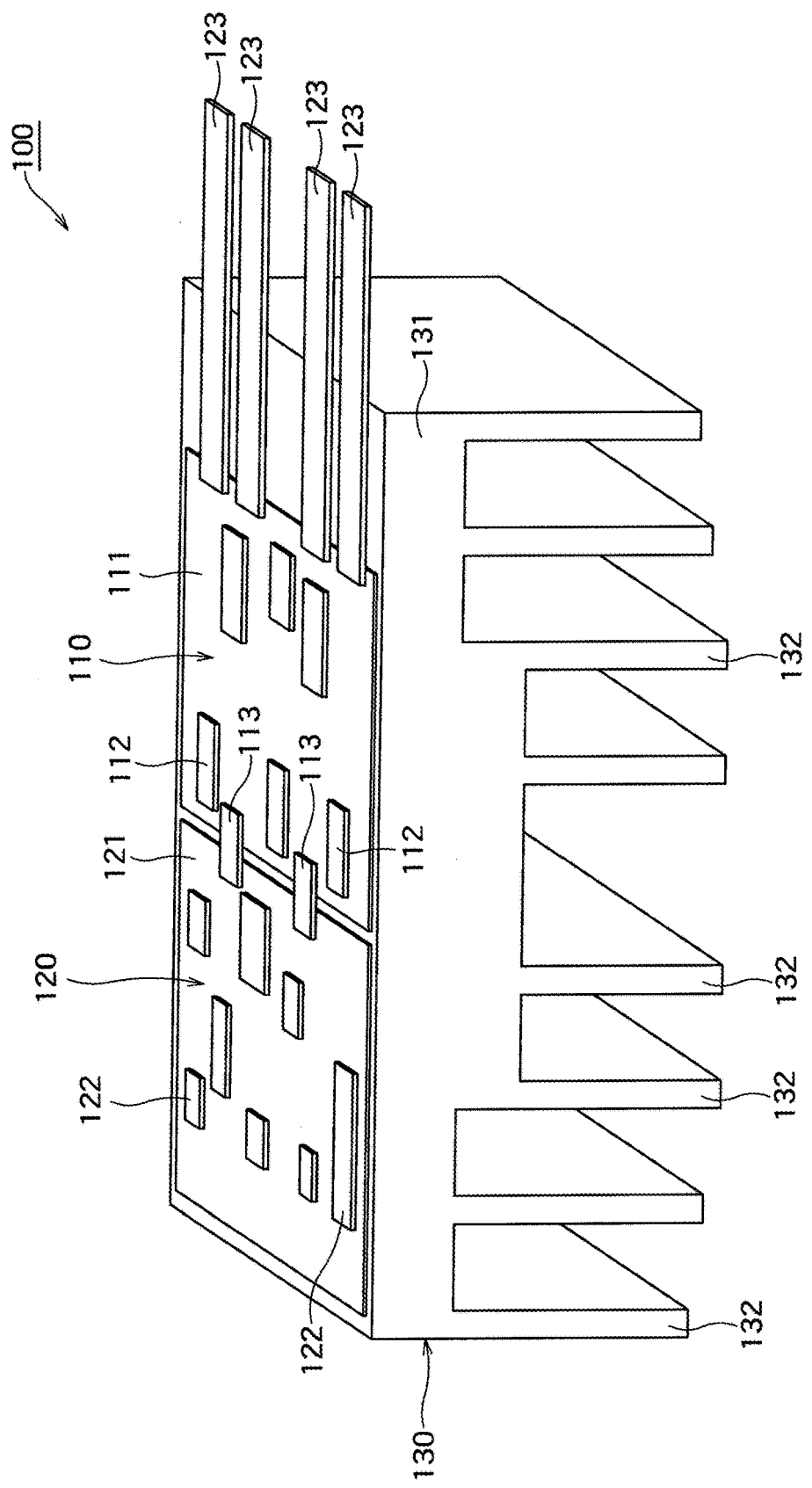
FIG. 6 is a perspective view of a conventional electronic module.

A second embodiment of the present invention will be described with reference to FIG. 5. FIG. 5 is a cross sectional view of an electronic module 1A according to the second embodiment. One of differences between the second embodiment and the first embodiment is in their configurations of the cap part. The second embodiment will be described below focusing on the difference.

As shown in FIG. 5, in the second embodiment, a cap part 40A covers the principal surface 21b of the substrate 21, and a space between the substrate 11 and the substrate 21 is not covered with the cap part 40A. In addition, the outer surface of the cap part 40A is in contact with the inner wall surface of the housing part 31a of the heat sink 30.

Note that the cap part 40A is preferably made of a metal having a surface subjected to insulating treatment (for example, an aluminum subjected to alumite treatment), but may be made of an insulator.

As shown in FIG. 5, the cap part 40A includes a resin injection hole 42 passing through the cap part 40A in a thickness direction. The resin injection hole 42 is provided on, for example, the upper surface (the surface facing the substrate 21) of the cap part 40A. A sealing resin 45A (to be described) can be formed by the injection of a resin through the resin injection hole 42.

By providing such a cap part 40A, heat from the electronic module 10 and the electronic module 20 can be transmitted to the heat sink 30 from not only the substrate 11 but also the cap part 40A. As a result, as in the case with the first embodiment, according to the second embodiment, both downsizing electronic module and enhancing the thermal radiation property can be achieved.

Note that, as shown in FIG. 5, the electronic module 1A may further include the sealing resin 45A filling the inside of the cap part 40A. The sealing resin 45A fills the inside of the cap part 40A so as to embed the electronic element 23. This can enhance resistances to exterior environment conditions such as vibration, temperature, and humidity.

In addition, as shown in FIG. 5, the electronic module 1A may further include a sealing resin 45B that fills between the electronic module 10 and the electronic module 20 so as to embed the electronic element 12 and the electronic element 22.

The sealing resins 45A and 45B each may be made of a resin containing a filler made of a material that has a high thermal conductivity thereby enhancing a heat conductive property. This can further enhance the thermal radiation property of the electronic module 1A.

Next, a method of manufacturing the electronic module 1A according to the second embodiment will be described. Since the steps up to producing the stack module 29 are the same to those of the method of manufacturing of the electronic module 1 according to the first embodiment, descriptions of the steps will be omitted, and the subsequent steps will be described.

As shown in FIG. 5, the cap part 40A having an outside shape fitting the housing part 31a of the heat sink 30 is put on the stack module 29 so as to cover the principal surface 21b of the substrate 21. In other words, the cap part 40A is put on the stack module 29 such that the opening edge of the cap part 40A abuts on the principal surface 21b of the substrate 21. The cap part 40A is fixed to the substrate 21 with an adhesive (such as a silicon adhesive).

Next, a resin is injected through the resin injection hole 42 of the cap part 40A, thereby filling the inside of the cap part 40A so as to embed the electronic element 23.

Next, the produced stack module 29 is housed in the housing part 31a of the heat sink 30 such that the principal surface 11b of the substrate 11 is in contact with the inner wall surface of the housing part 31a (housing step). In this step, the stack module 29 covered with the cap part 40A is housed in the heat sink 30 such that the outer surface of the cap part 40A is in contact with the inner wall surface of the housing part 31a. In addition, as shown in FIG. 5, in the housed state, the edges of the substrate 21 may be brought into contact with the inner wall surface of the housing part 31a, to further enhance the thermal radiation property.

Next, the inside of the housing part 31a is filled with a resin so as to embed the electronic element 12 and the electronic element 22. In this step, to prevent the resin from leaking from the housing part 31a and to make a resin filling operation easy, the housing part 31a is preferably formed into a depressed shape on the side surface or the upper surface of the base plate 31, rather than formed into a through hole.

Through the above steps, the electronic module 1A (FIG. 5) of which both of the downsizing and the thermal radiation property are achieved can be manufactured.

Although those skilled in the art may conceive an additional effect and various modifications of the present invention based on the foregoing descriptions, the aspects of the present invention are not limited to the abovementioned individual embodiments. Components over different embodiments may be combined as appropriate. Various additions, modifications, and partial deletions can be made in a range not deviating from the conceptual thought and gist of the present invention derived from in the claims and equivalents thereto.

REFERENCE SIGNS LIST 1, 1A electronic module
10, 20 electronic module
11, 21, 111, 121 substrate
11a, 11b, 21a, 21b principal surface
12, 22, 23, 112, 122 electronic element
12a controlling terminal
13, 24 insulating substrate
14, 25, 26 conductive pattern
15 conductive layer
15a depressed portion
16 conductive binder
17 heat conductive member
18, 19, 28 connecting member
21c side surface
27 through hole
29 stack module
30, 130 heat sink
31, 131 base plate
31a housing part
32, 132 fin
40, 40A cap part
41, 42 resin injection hole
45, 45A, 45B sealing resin
100 regulator
110 power part
113 connecting terminal
120 controlling part
123 external connecting terminal

The invention claimed is:

1. An electronic module comprising:
   a first electronic module including a first substrate that has a first principal surface and a second principal surface on a side opposite to the first principal surface, and a first electronic element that is mounted on the first principal surface;
   a second electronic module including a second substrate that has a third principal surface and a fourth principal surface on a side opposite to the third principal surface and that is arranged such that the third principal surface faces the first principal surface, a second electronic element that is mounted on the third principal surface and is electrically connected to the first electronic element with a first connecting member therebetween, and a third electronic element that is mounted on the fourth principal surface and is electrically connected to the first electronic element with a second connecting member therebetween passing through the second substrate in a thickness direction, the second electronic module being thermally connected to the first electronic module by the first and second connecting members; and
   a heat sink including a base plate that has a housing part therein, and housing the first and second electronic modules in the housing part such that the second principal surface of the first substrate is in contact with an inner wall surface of the housing part and that an end portion of the first substrate is in direct contact with a concave portion provided in an inner wall of the housing part of the base plate,
   wherein a plurality of fins are erected on the base plate of the heat sink.

2. The electronic module according to claim 1 further comprising a cap part that houses the second substrate and covers the first principal surface of the first substrate, an outer surface of the cap part being in contact with an inner wall surface of the housing part of the heat sink, wherein a side surface of the second substrate is in contact with an inner surface of the cap part.

3. The electronic module according to claim 2, wherein the cap part is made of a metal having a surface subjected to insulating treatment.

4. The electronic module according to claim 2 further comprising a sealing resin that fills an inside of the cap part so as to embed the first electronic element, the second electronic element, and the third electronic element.

5. The electronic module according to claim 1 further comprising a cap part that covers the fourth principal surface of the second substrate, an outer surface of the cap part being in contact with an inner wall surface of the housing part of the heat sink.

6. The electronic module according to claim 5, wherein the cap part is made of a metal having a surface subjected to insulating treatment.

7. The electronic module according to claim 5 further comprising a sealing resin that fills an inside of the cap part so as to embed the third electronic element.

8. The electronic module according to claim 5 further comprising a sealing resin that fills between the first electronic module and the second electronic module so as to embed the first electronic element and the second electronic element.

9. The electronic module according to claim 1, wherein the first substrate includes:
   a first insulating substrate;
   a conductive pattern that is provided on a principal surface on a first principal surface side of the first insulating substrate and is electrically connected to the first electronic element with a conductive binder therebetween; and
   a conductive layer that is provided on a principal surface on a second principal surface side of the first insulating substrate and is in contact with the inner wall surface of the housing part of the heat sink.

10. The electronic module according to claim 9, wherein a depressed portion is provided on the conductive layer, and a heat conductive member is arranged in the depressed portion so as to be in contact with the inner wall surface of the housing part.

* * * * *